(12) United States Patent
Wang

(10) Patent No.: US 8,893,369 B2
(45) Date of Patent: Nov. 25, 2014

(54) PACKAGING STRUCTURE FOR ASSEMBLING TO PRINTED CIRCUIT BOARD

(76) Inventor: Ting-Jui Wang, New Taipei (TW)

( * ) Notice: Subject to any disclaimer, the term of this patent is extended or adjusted under 35 U.S.C. 154(b) by 0 days.

(21) Appl. No.: 13/483,644

(22) Filed: May 30, 2012

(65) Prior Publication Data

US 2012/0233851 A1    Sep. 20, 2012

Related U.S. Application Data

(63) Continuation-in-part of application No. 12/574,719, filed on Oct. 7, 2009, now Pat. No. 8,291,583.

(30) Foreign Application Priority Data

Oct. 9, 2008  (TW) ................................ 97139033 A

(51) Int. Cl.
*B23P 11/02* (2006.01)
*H05K 3/34* (2006.01)

(52) U.S. Cl.
CPC .... *H05K 3/3447* (2013.01); *H05K 2201/10113* (2013.01); *H05K 2201/10333* (2013.01); *H05K 2203/0195* (2013.01); *H05K 2203/082* (2013.01)
USPC .............. 29/453; 29/525.01; 29/729; 29/739; 411/353

(58) Field of Classification Search
USPC .............. 29/729, 739, 592.1, 525.01–525.14, 29/832, 842; 411/352.171, 353, 347, 107
See application file for complete search history.

(56) References Cited

U.S. PATENT DOCUMENTS

| | | | | |
|---|---|---|---|---|
| 3,346,032 | A | * | 10/1967 | Gulistan ....................... 411/349 |
| 5,382,124 | A | | 1/1995 | Frattarola |
| 6,238,155 | B1 | | 5/2001 | Aukzemas et al. |
| 6,468,012 | B2 | * | 10/2002 | Ellis et al. ..................... 411/353 |
| 6,761,521 | B2 | | 7/2004 | McCormack et al. |
| 6,814,530 | B2 | * | 11/2004 | Franco et al. .................. 411/353 |
| 7,083,371 | B2 | * | 8/2006 | McAfee ......................... 411/107 |
| 7,213,321 | B2 | * | 5/2007 | Franco et al. ................... 29/453 |
| 7,703,200 | B2 | * | 4/2010 | Wang et al. .................... 29/843 |
| 8,113,755 | B2 | * | 2/2012 | Wang ............................. 411/352 |
| 2009/0202319 | A1 | * | 8/2009 | Wang et al. ................... 411/353 |

OTHER PUBLICATIONS

Office Action (Mail Date: Feb. 8, 2012) for U.S. Appl. No. 12/574,719, filed Oct. 7, 2009.

* cited by examiner

*Primary Examiner* — Minh Trinh
(74) *Attorney, Agent, or Firm* — Schmeiser, Olsen & Watts, LLP

(57) ABSTRACT

A packaging structure for assembling to a printed circuit board (PCB) comprises a captive screw having a screw head, a threaded shank and a sleeve; and a fixture pressing against the screw head for a part of the threaded shank to expose from a distal end of the sleeve, and clamping the fixture on the sleeve.

3 Claims, 9 Drawing Sheets

PACKAGING STRUCTURE FOR ASSEMBLING TO PRINTED CIRCUIT BOARD

CROSS-REFERENCE TO RELATED APPLICATION

This application is a continuation-in-part patent application of U.S. application Ser. No. 12/574,719 filed on Oct. 7, 2009, now U.S. Pat. No. 8,291,583, the entire contents of which are hereby incorporated by reference for which priority is claimed under 35 U.S.C. §120.

FIELD OF TECHNOLOGY

The present invention relates to a packaging structure for assembling to a printed circuit board (PCB), and more particularly to a packaging structure that enables a captive screw to be easily and accurately assembled to a PCB without deviation and skew.

BACKGROUND

FIG. 1 shows a conventional captive screw 5 for using with a printed circuit board (PCB). The captive screw 5 includes a screw head 51, a threaded shank 52, and a sleeve 53 having a free end with an axially extended toothed flange 531. The sleeve 53 normally encloses the threaded shank 52 and is retractable into the screw head 51 under pressure to expose the threaded shank 52, as shown in FIG. 2. To assemble the captive screw 5 to a PCB 7, first align the sleeve 53 with a through hole 71 provided on the PCB 7, as shown in FIG. 3. Then, apply a downward force on the screw head 51, so that the toothed flange 531 of the sleeve 53 is pressed into the through hole 71, as shown in FIG. 4. And, keep applying the downward force until the toothed flange 531 is completely fitted in the through hole 71 to connect the captive screw 5 to the PCB 7, as shown in FIG. 5.

The above conventional manner of assembling the captive screw 5 to the PCB 7 has some disadvantages: (a) The sleeve 53 is directly aligned with the through hole 71. However, since the screw head 51 and the sleeve 53 could not be held together through compression, the captive screw 5 must be manually positioned above and aligned with the through hole 71. (b) Since the captive screw 5 is very small in volume and the through hole 71 has a relatively small diameter, the manual position of the captive screw 5 above the through hole 71 is subject to error, preventing the flange 531 of the sleeve 53 from being easily and accurately aligned with the through hole 71 and resulting in a poorly assembled or even a damaged PCB 7. (c) In the event the flange 531 of the sleeve 53 is not pressed into the through hole 71 in one single operation, the flange 531 tends to be incompletely fitted in the through holes 71 and becomes deviated or skewed due to inaccurate planeness of the PCB 7. (d) To assemble the captive screw 5 to the PCB 7 by pressing the toothed flanges 531 of the sleeves 53 into the through holes 71, the captive screw 5 is individually picked up and moved to the PCB 7. Therefore, the assembly of a large amount of captive screws 5 to the PCB 7 could not be efficiently carried out using the surface mount technology (SMT) that has been widely employed in the electronic industrial field.

SUMMARY

A primary object of the present invention is to provide a packaging structure for assembling to a PCB, so that a captive screw can be easily and accurately assembled to the PCB with a sleeve of the captive screw firmly fitted in a through hole on the PCB without the risk of becoming deviated or skewed in position.

To achieve the above and other objects, the packaging structure for assembling to a PCB according to a preferred embodiment of the present invention comprises:

A captive screw, including a screw head, a threaded shank downward extended from a lower end of the screw head, and a sleeve fitted around and movable along the threaded shank; and A fixture, pressing against the screw head to make the screw head toward a first end of the sleeve, and make a part of the threaded shank exposing from an opposing second end of the sleeve, and clamping the fixture on an outer surface of the sleeve.

When utilizing the packaging structure, providing a printed circuit board (PCB) having a plurality of through holes formed thereon, and applying a layer of solder on a top of the PCB; bringing a tool to contact with the fixture so as to pick up the packaging structure, and then moving the tool to align the exposed threaded shank with one of the through holes on the PCB; releasing the tool from the packaging structure and allowing the packaging structure to fall, so that a flange axially extended from the second end of the sleeve is extended into the through hole; heating and melting the layer of solder and then allowing the molten solder layer to cool down to a room temperature and become hardened again, so that the second end of the sleeve is fixedly held to the PCB with the flange firmly fitted in the through hole; and removing the fixture from the sleeve and the screw head.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION

Figure 1:
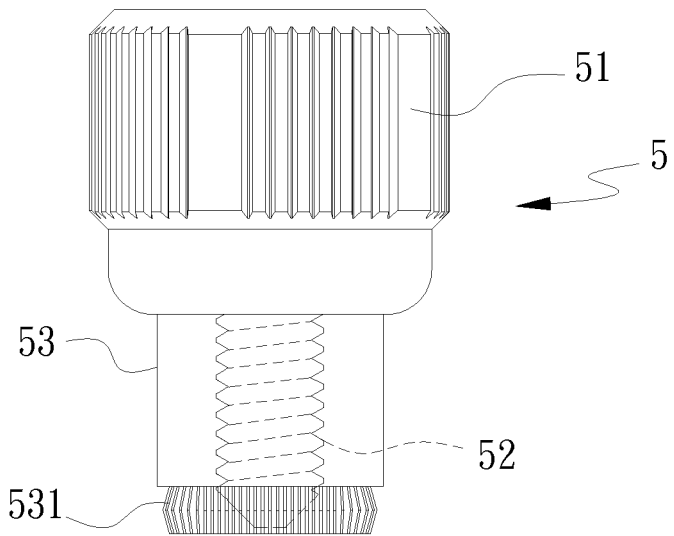
FIG. 1 shows a conventional captive screw with a sleeve thereof extended from a screw head of the captive screw.
Figure 2:
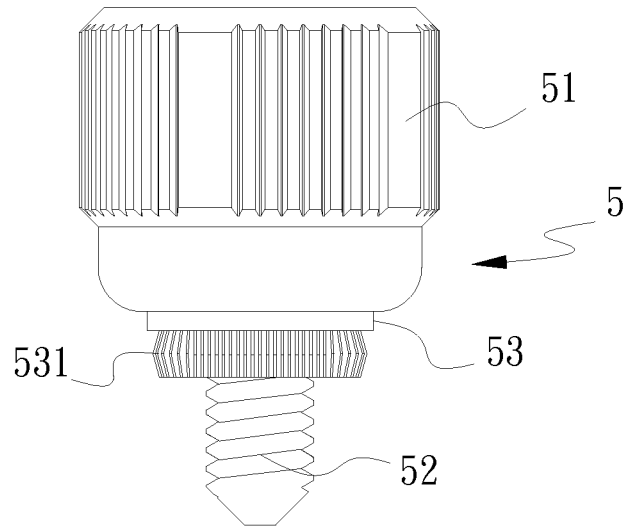
FIG. 2 shows the captive screw of FIG. 1 with the sleeve retracted into the screw head to expose a threaded shank of the captive screw.
Figure 3:
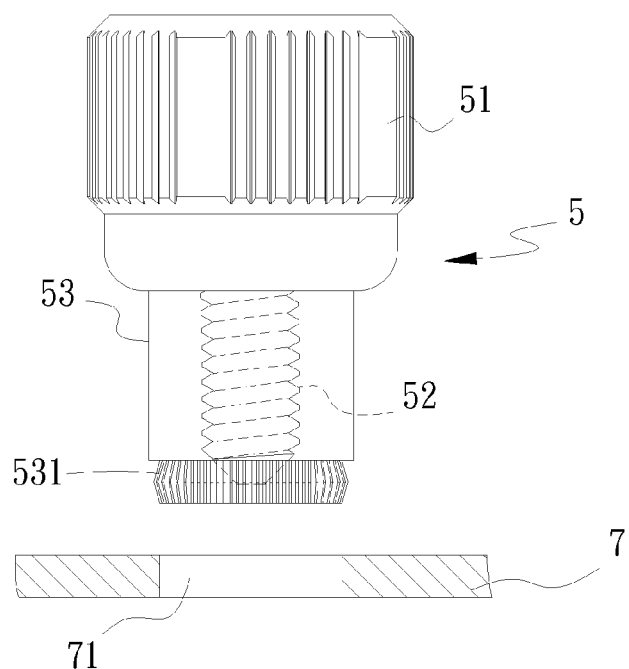
FIGS. 3 to 5 show the steps of assembling the captive screw of FIG. 1 to a PCB according to a conventional packaging method.
Figure 4:
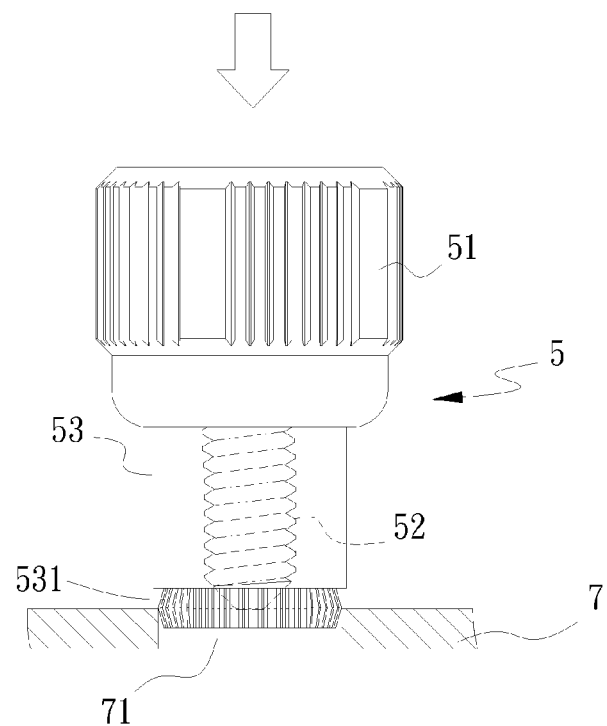
Figure 5:
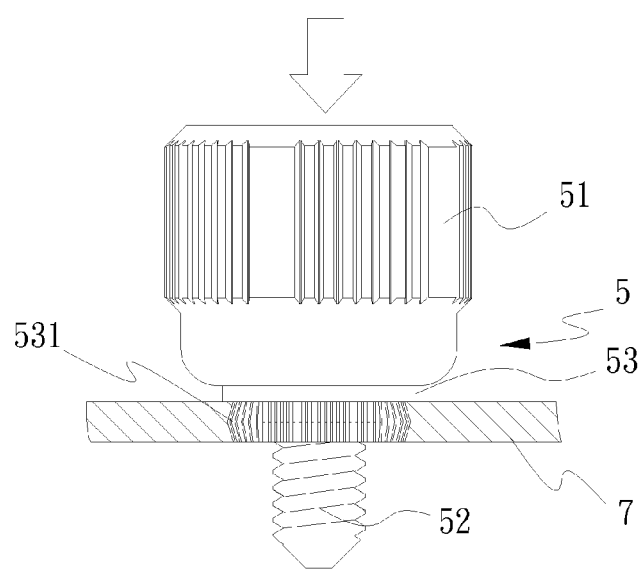
Figure 6:
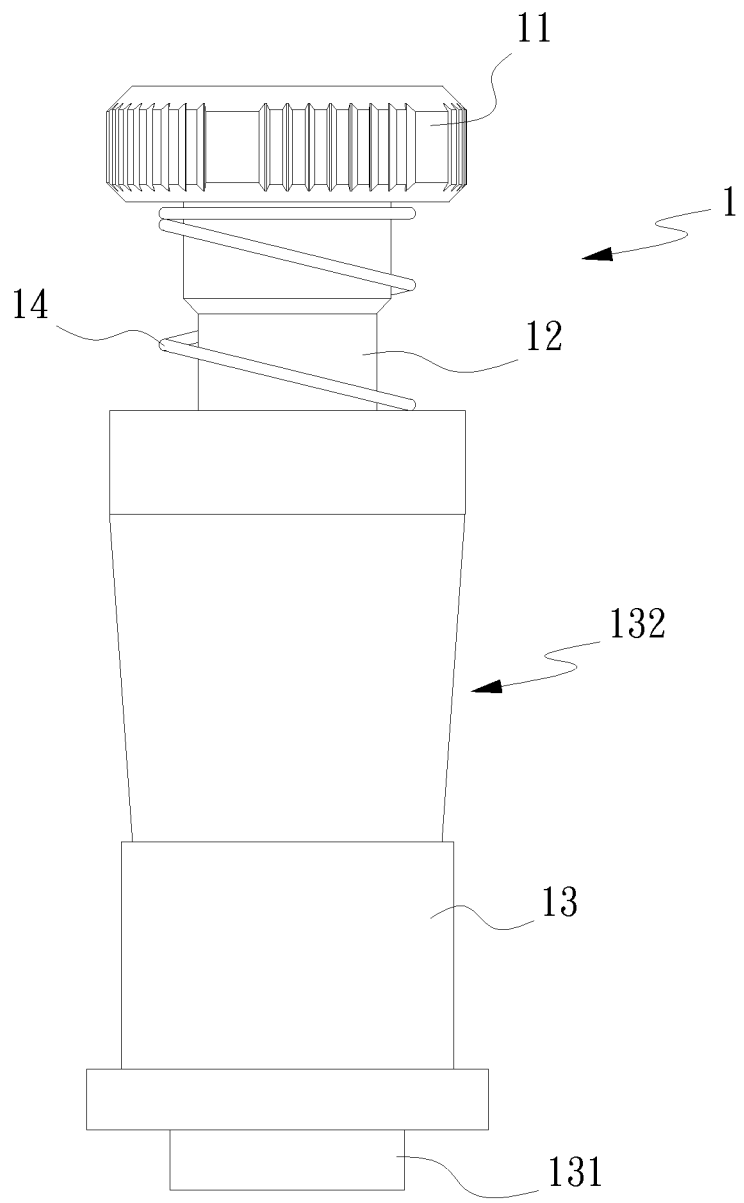
FIG. 6 shows a captive screw based on which the packaging structure of the present invention is implemented.
Figure 7:
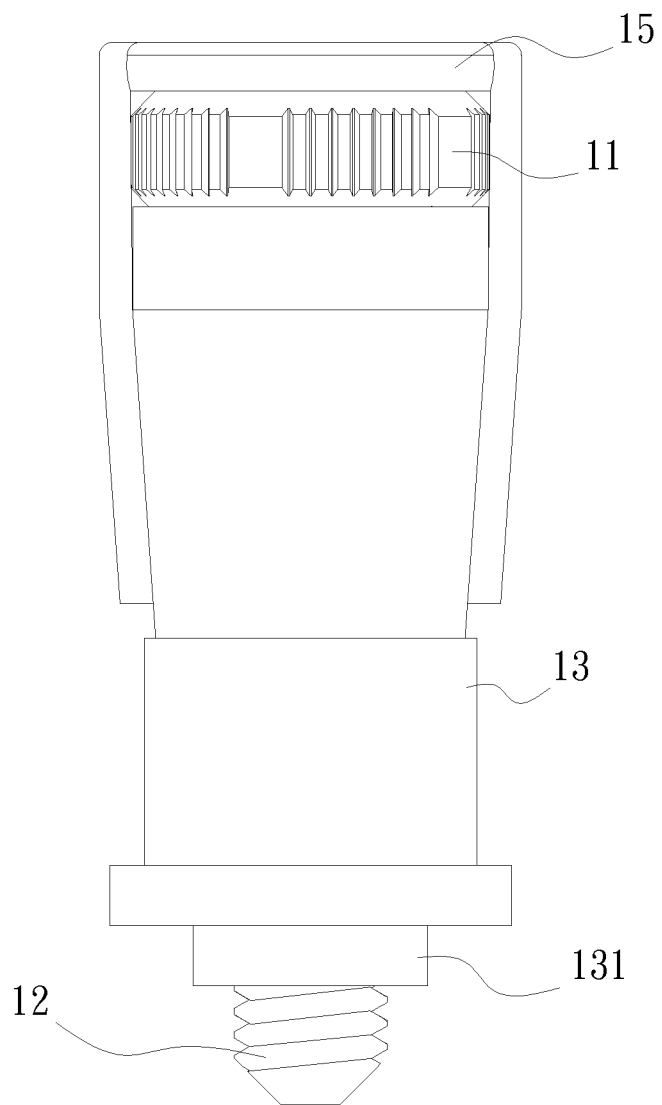
FIG. 7 shows a fixture is clamped onto a sleeve of the captive screw to expose a threaded shank from the sleeve.

Please refer to FIGS. 6 to 7 that showing a packaging structure for assembling to a through hole of a printed circuit board (PCB) according to a preferred embodiment of the present invention comprising:

A captive screw 1, including a screw head 11, a threaded shank 12 downward extended from a lower end of the screw head 11, a sleeve 13 fitted around and elastically movable along the threaded shank 12, and a spring 14 having an end pressed against the lower end of the screw head 11 and another opposing end set in and pressed against the sleeve 13. With the spring 14, the sleeve 13 is elastically movable along the threaded shank 12; and A fixture 15, pressing against the screw head 11, and the fixture 15 is clamped on an outer surface of the sleeve 13. When the fixture 15 is pressed against the screw head 11, the screw head 11 is toward a first end of the sleeve 13, so that a part of the threaded shank 12 is exposed from an opposing second end of the sleeve 13, and clamping the fixture 15 on the outer surface of the sleeve 13. The sleeve 13 is provided on and around the outer surface with a recess 132. The fixture 15 is clamped on the sleeve 13 at the recess 132, so as to firmly hold the screw head 11 to the first end of the sleeve 13 for the threaded shank 12 to expose from the second end of the sleeve 13.

Figure 8:
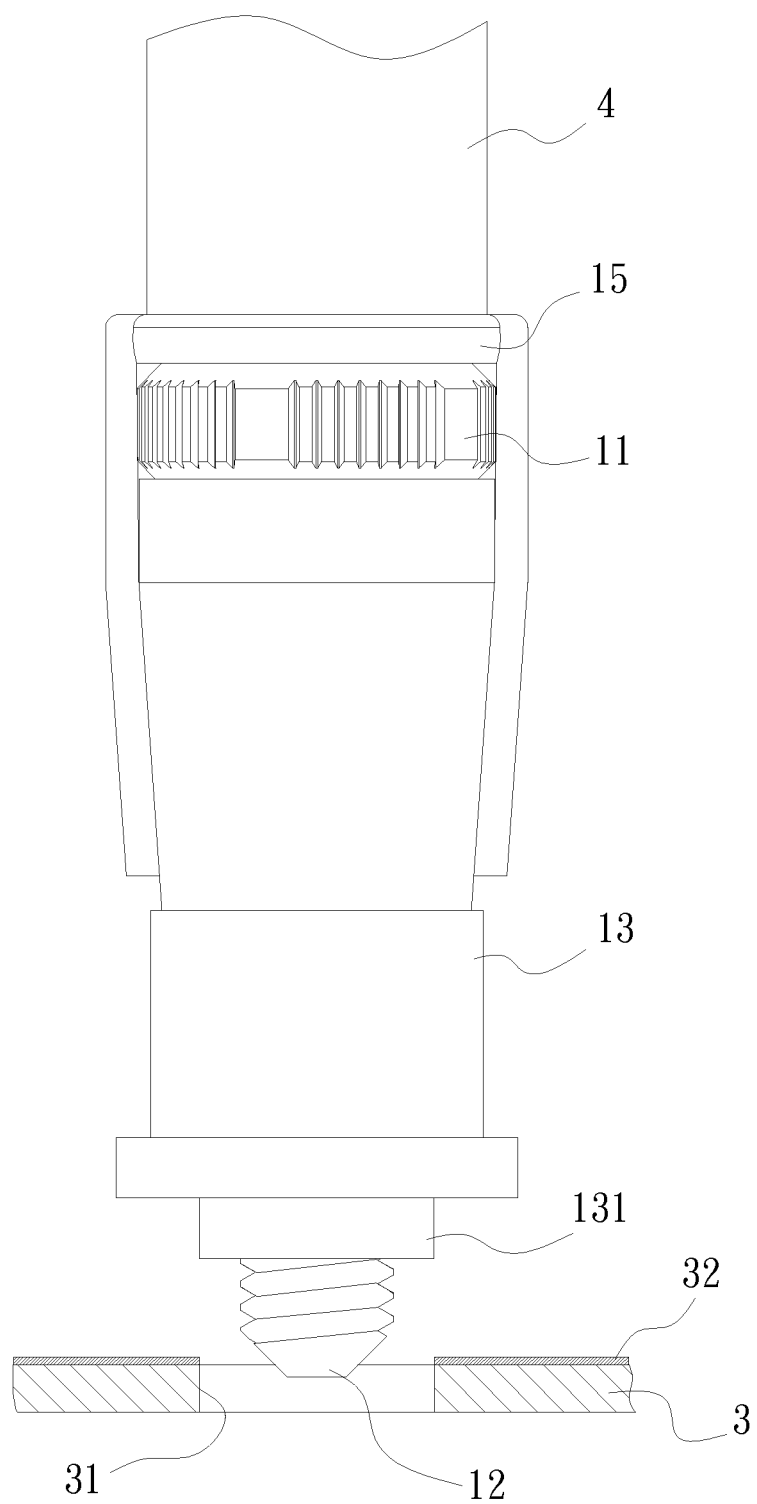
FIG. 8 shows the exposed threaded shank of the captive screw is aligned with a through hole on a PCB using a tool.

As shown in FIG. 8, when utilizing the packaging structure, a printed circuit board (PCB) 3 having a plurality of through holes 31 is provided, and a layer of solder 32 is applied on a top of the PCB 3.

Also as shown in FIG. 8, a tool 4 is used to contact with the fixture 15 so as to pick up the packaging structure. Then, the tool 4 is moved to align the threaded shank 12 of the captive screw 1 with one of the through holes 31 on the PCB 3 while a distance about 0.4 mm is left between the second end of the sleeve 13 of the captive screw 1 and the through hole 31. The tool 4 may be a vacuum sucking device.

Figure 9:
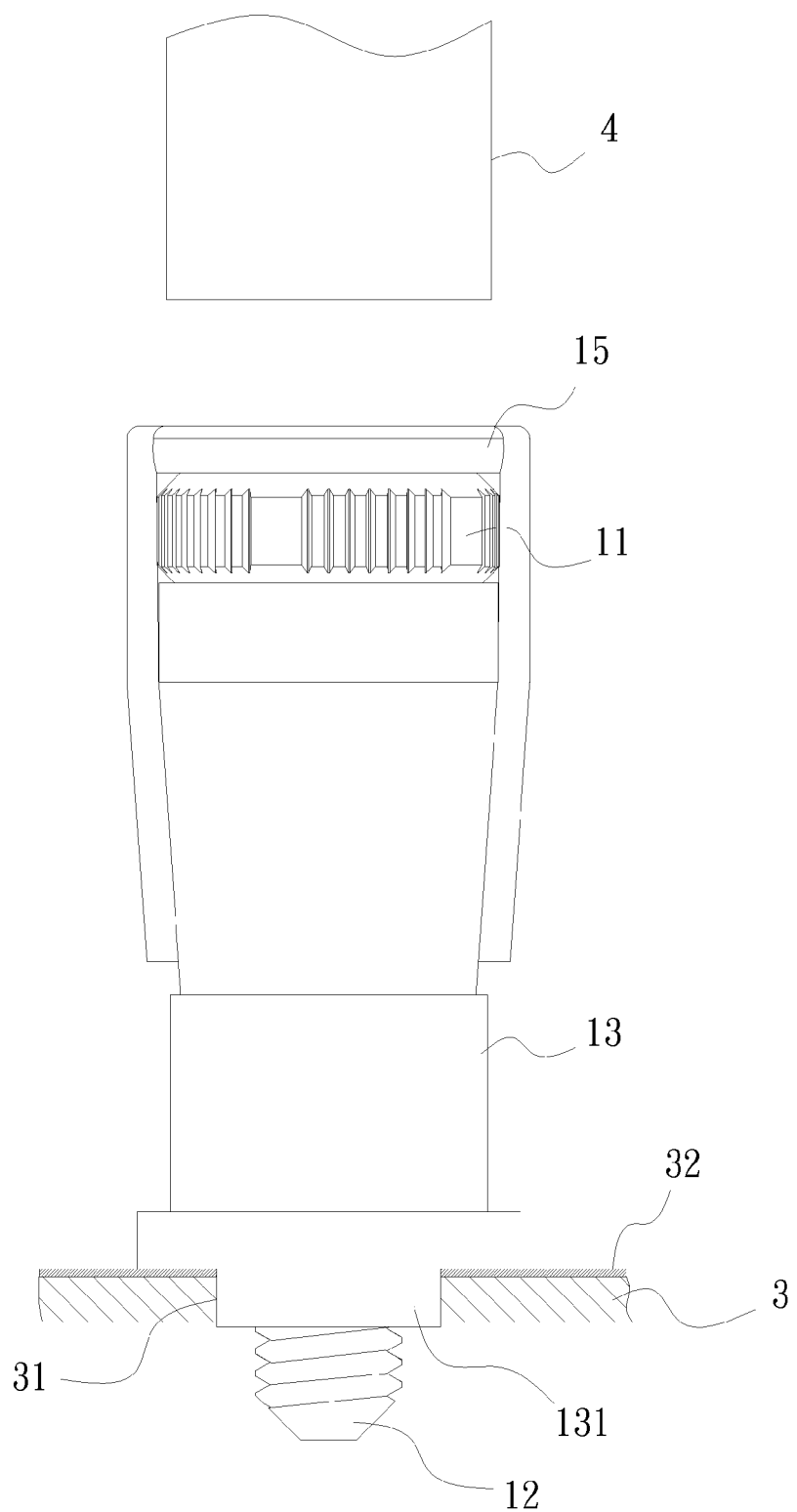
FIG. 9 shows the packaging structure is released from the tool.

As shown in FIG. 9, the packaging structure is released from the tool 4 and allowed to fall, so that a flange 131 axially extended from the second end of the sleeve 13 is extended into the through hole 31.

Figure 10:
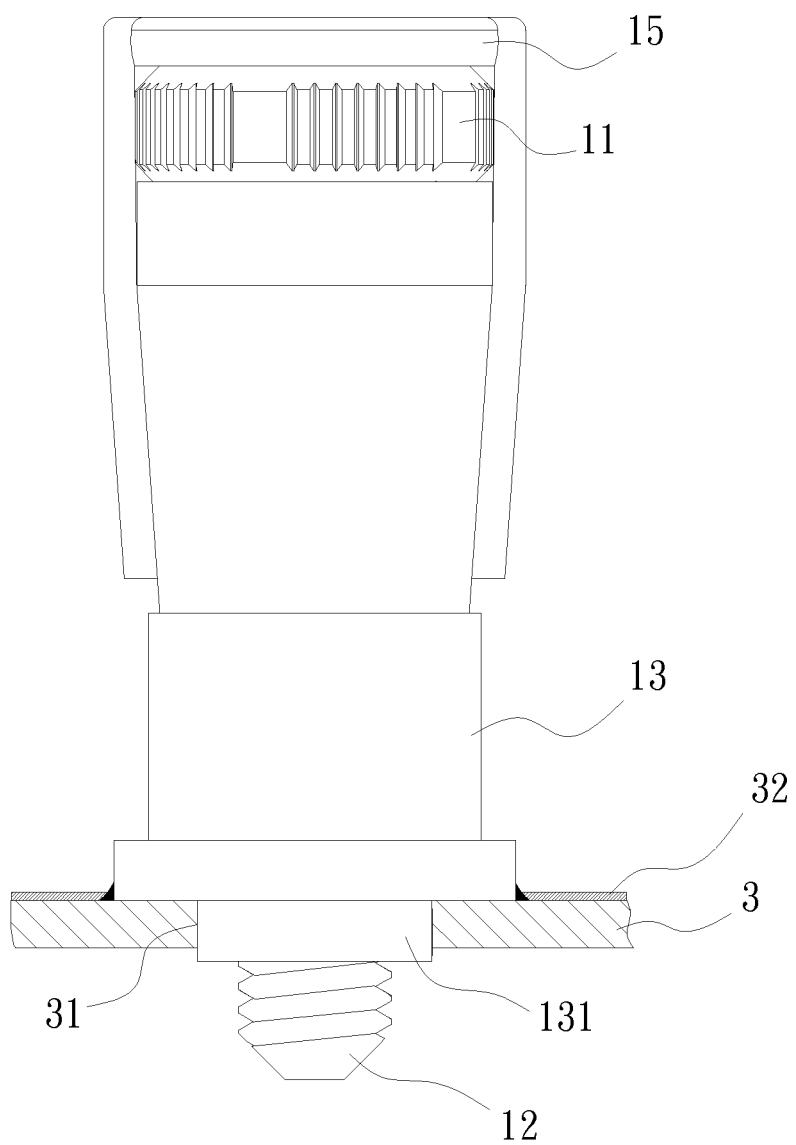
FIG. 10 shows a flange axially extended from the sleeve of the captive screw is firmly fitted in the through hole on the PCB.

As shown in FIG. 10, the layer of solder 32 is heated to melt and then allowed to cool down to a room temperature and become hardened again, so as to fixedly hold the second end of the sleeve 13 to the PCB 3 with the flange 131 firmly fitted in the through hole 31.

Figure 11:
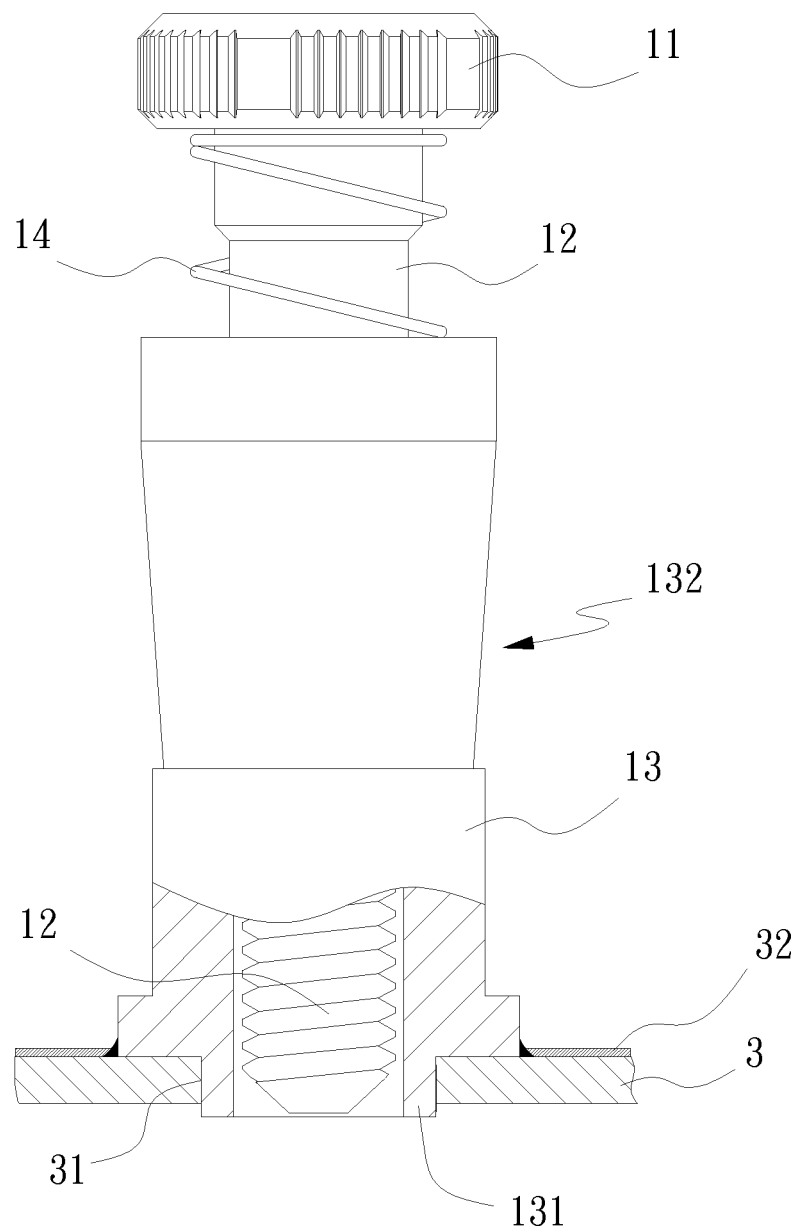
FIG. 11 shows the fixture is removed from the sleeve and the screw head is sprung upward to retract the threaded shank into the sleeve.

As shown in FIG. 11, the fixture 15 is removed from the sleeve 13 and the screw head 11. At this point, the screw head 11 is automatically sprung upward by the spring 14, bringing the threaded shank 12 to retract into the sleeve 13 that has already been fixedly held to the PCB 3.

Briefly speaking, when using the packaging structure of the present invention to assemble to the PCB 3, first use the fixture 15 to press the screw head 11 toward the first end of the sleeve 13 to expose a part of the threaded shank 12 from the second end of the sleeve 13, allowing the captive screw 1 to be packaged to a uniform packaging level on the PCB 3 and the flange 131 at the second end of the sleeve 13 to be accurately extended into the through hole 31 on the PCB 3 without deviation and skew.

With the packaging structure of the present invention, the flange of the sleeve of the captive screw can be easily and accurately held in the through hole on the PCB without deviation and skew to thereby enable correct assembly of the captive screw to the PCB. Therefore, the present invention effectively overcomes the problems in the conventional manner of mounting a captive screw on a PCB.

The present invention has been described with a preferred embodiment thereof and it is understood that many changes and modifications in the described embodiment can be carried out without departing from the scope and the spirit of the invention that is intended to be limited only by the appended claims.

What is claimed is:

1. A packaging structure for assembling to a printed circuit board (PCB), the packaging structure is assembled to a through hole of the printed circuit board, comprising:
    a captive screw, including a screw head, a threaded shank extended from a lower end of the screw head, and a sleeve fitted around and movable along the threaded shank; and
    a temporarily clamped fixture, the temporarily clamped fixture pressing against the screw head to make the screw head move toward a first end of the sleeve, exposing a part of the threaded shank from an opposing second end of the sleeve, wherein the temporarily clamped fixture is clamped onto an outer surface of the sleeve;
    wherein, after the second end of the sleeve is fixedly attached to the printed circuit board when a flange of the sleeve is fitted through the through hole of the printed circuit board, the temporarily clamped fixture is removed from the sleeve and the screw head.

2. The packaging structure for assembling to a PCB as claimed in claim 1, wherein the captive screw further includes a spring, the spring having an end pressed against the lower end of the screw head and another opposing end set in and pressed against the sleeve.

3. The packaging structure for assembling to a PCB as claimed in claim 1, wherein the sleeve is provided on and around an outer surface with a recess, and the temporarily clamped fixture being clamped on the sleeve at the recess.

* * * * *